United States Patent
Arita et al.

(10) Patent No.: US 7,989,803 B2
(45) Date of Patent: *Aug. 2, 2011

(54) MANUFACTURING METHOD FOR SEMICONDUCTOR CHIPS AND SEMICONDUCTOR WAFER

(75) Inventors: Kiyoshi Arita, Fukuoka (JP); Teruaki Nishinaka, Saga (JP)

(73) Assignee: Panasonic Corporation, Osaka (JP)

( * ) Notice: Subject to any disclaimer, the term of this patent is extended or adjusted under 35 U.S.C. 154(b) by 387 days.

This patent is subject to a terminal disclaimer.

(21) Appl. No.: 11/792,815

(22) PCT Filed: Jan. 10, 2006

(86) PCT No.: PCT/JP2006/000409
§ 371 (c)(1),
(2), (4) Date: Jun. 12, 2007

(87) PCT Pub. No.: WO2006/075725
PCT Pub. Date: Jul. 20, 2006

(65) Prior Publication Data
US 2008/0128694 A1 Jun. 5, 2008

(30) Foreign Application Priority Data
Jan. 12, 2005 (JP) ................................. 2005-004860

(51) Int. Cl.
*H01L 23/58* (2006.01)
(52) U.S. Cl. ........ 257/48; 438/11; 438/18; 257/E21.524
(58) Field of Classification Search .................. 438/460, 438/462; 430/5; 257/E23.179, E21.524, 257/48
See application file for complete search history.

(56) References Cited

U.S. PATENT DOCUMENTS

| 6,114,072 | A  | * | 9/2000  | Narimatsu ....................... 430/5 |
| 6,329,700 | B1 |   | 12/2001 | Ishimura et al. ............... 257/620 |
| 6,714,031 | B2 | * | 3/2004  | Seki .............................. 324/763 |
| 6,893,943 | B2 | * | 5/2005  | Ohsumi et al. ................ 438/462 |
| 2002/0111028 | A1 |   | 8/2002 | Arima et al. .................. 438/694 |
| 2002/0192928 | A1 |   | 12/2002 | Kosugi .......................... 438/462 |
| 2004/0102025 | A1 | * | 5/2004 | Arita .............................. 438/460 |

FOREIGN PATENT DOCUMENTS
JP    60-35514    2/1985
(Continued)

OTHER PUBLICATIONS
Patent Cooperation Treaty (PCT) International Preliminary Report on Patentability, issued Jul. 17, 2007 in International Application No. PCT/JP2006/300409.

*Primary Examiner* — Matthew E Warren
*Assistant Examiner* — Fang-Xing Jiang
(74) *Attorney, Agent, or Firm* — Wenderoth, Lind & Ponack L.L.P.

(57) ABSTRACT

In a semiconductor wafer that has semiconductor devices arranged in a plurality of device-formation-regions and a TEG placed in dividing regions that define the device-formation-regions, a TEG-placement portion is arranged in the dividing regions partially expanded in width, and the TEG is placed in the TEG-placement portion. Additionally, a protective sheet is stuck to the semiconductor wafer, then plasma etching is performed, and the TEG is removed in a state where it remains in the dividing region and stuck to the protective sheet together with the protective sheet by peeling off the protective sheet, thereby the device-formation-regions are divided into individual pieces, and the semiconductor chips are manufactured.

20 Claims, 11 Drawing Sheets

FOREIGN PATENT DOCUMENTS

| | | |
|---|---|---|
| JP | 5-326696 | 12/1993 |
| JP | 8-123011 | 5/1996 |
| JP | 2000-340746 * | 12/2000 |
| JP | 2001-60568 | 3/2001 |
| JP | 2002-231659 | 8/2002 |
| JP | 2003-234312 | 8/2003 |
| JP | 2004-172365 | 6/2004 |
| JP | 2004-265902 | 9/2004 |

* cited by examiner

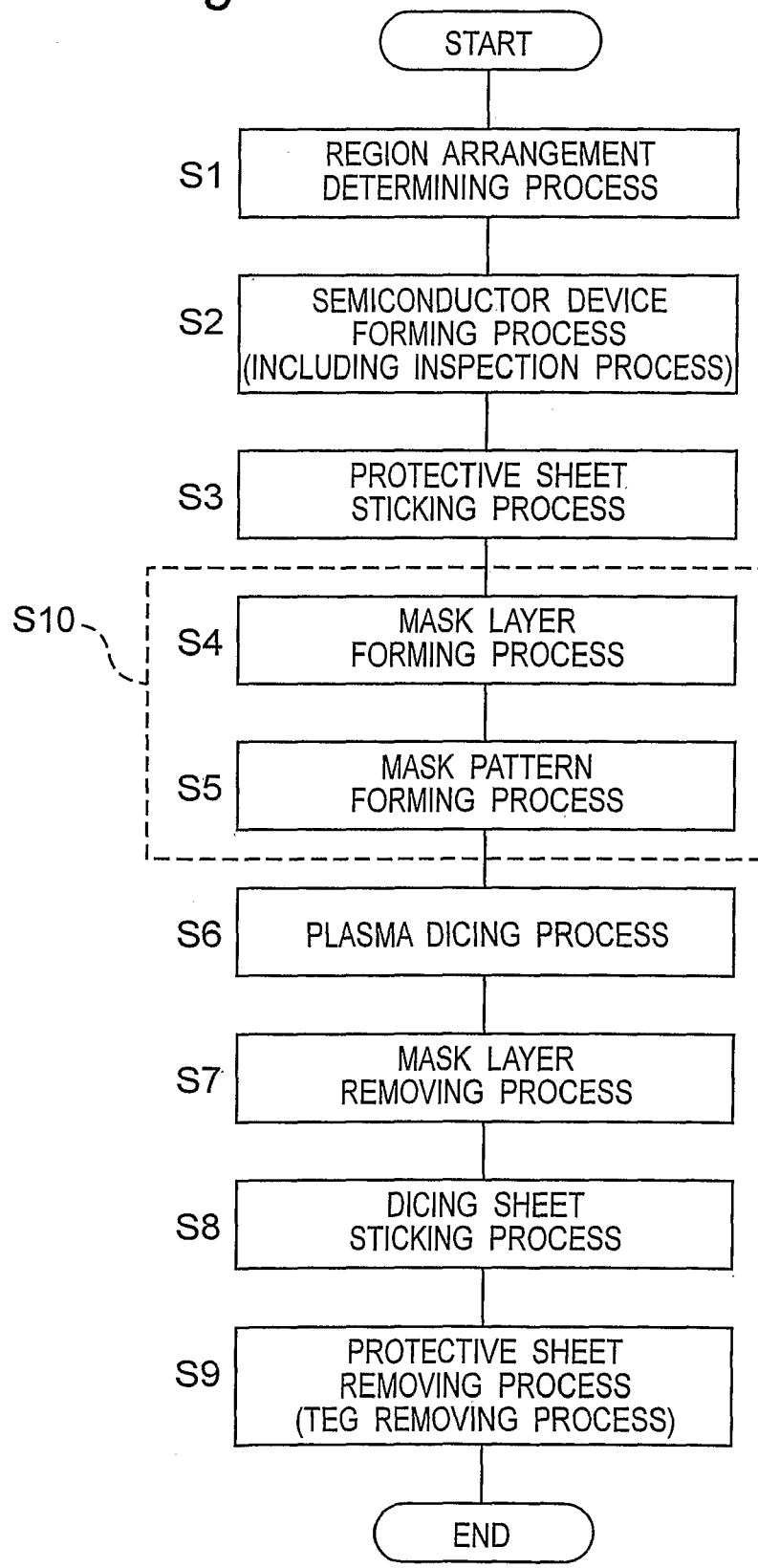

MANUFACTURING METHOD FOR SEMICONDUCTOR CHIPS AND SEMICONDUCTOR WAFER

TECHNICAL FIELD

The present invention relates to a semiconductor wafer where semiconductor devices are formed and arranged in a plurality of device-formation-regions defined by dividing regions and a Test Element Group (TEG) is placed in the dividing regions. The present invention also relates to a manufacturing method for semiconductor chips, each of which includes the semiconductor device individualized from the semiconductor wafer by individually dividing the device-formation-regions along the dividing regions.

BACKGROUND ART

Conventionally, various methods for manufacturing a plurality of semiconductor chips by dividing such a semiconductor wafer have been known. For example, a method is known of collectively forming semiconductor devices in a plurality of device-formation-regions provided on a wafer of single-crystal silicon or the like, mechanically cutting (i.e., by dicing) the wafer along dividing regions located between adjacent device-formation-regions and manufacturing semiconductor chips by individualizing the device-formation regions.

Moreover, in such a wafer, an evaluation device (test device) that is called a Test Element Group (TEG) is formed in the dividing regions. In various processes of the semiconductor chip manufacturing process, the actual device characteristics are monitored by investigating various characteristics by means of the thus-formed TEG.

Moreover, it is often the case where such a TEG is formed of a material that contains various kinds of metals and inorganic substances besides silicon and silicon oxide that are generally the principal materials of the wafer. Moreover, the formed TEG becomes unnecessary after the various characteristics are investigated, and the TEG is removed by cutting (or dicing) in the stage of wafer dicing along the dividing regions.

Although shrinkage (narrowing) of the dividing region has been promoted to increase the number of semiconductor chips obtainable per a wafer or to expand the device-formation-regions in recent years, there is a limitation in narrowing the width of the TEG formation region from the viewpoint of reliably carrying out various electrical measurements. Therefore, the dividing regions are narrowed by reducing a gap between the edge portion of the TEG formation region and the edge portion of the dividing regions.

On the other hand, generating minute fragments (chipping) or generating minute cracks (microcracks) is easily caused by impacts during cutting by a blade during wafer dicing, and therefore, it is necessary to carry out the cutting by the blade in a position located apart from the device-formation-region by some degree. Therefore, if the narrowing of the dividing regions as described above is promoted, the TEG cannot completely be removed by the cutting. If the TEG remains partially unremoved, short circuiting or the like occurs due to the contact of the TEG with the wiring pattern when the semiconductor chip is mounted, and thus it is a concern that the problem of circuit failure might occur.

In order to suppress the occurrence of these problems, various methods have been considered as a method for removing the TEG by cutting, as disclosed in, for example, Japanese unexamined patent publication No. 2002-231659 and No. 2001-60568.

DISCLOSURE OF INVENTION

In recent years, plasma dicing using plasma etching has attracted attention as a novel dicing technology for wafer dividing (refer to, for example, Japanese unexamined patent publication No. 2004-172365). However, it is often the case where the TEG is formed of various metals and inorganic substances unlike silicon and silicon oxide. Accordingly, there is a problem that the TEG cannot completely be removed by the etching and remains unremoved by the plasma dicing (e.g., plasma dicing using a fluorine based plasma) that uses a gas for etching the silicon based material.

Therefore, it is considered to remove the TEG by etching by performing the etching with the gas type changed during the plasma dicing. However, there is a problem that time and labor for changing the gas type of the etching are needed in such a case, and the efficiency of the semiconductor chip manufacturing process is hindered.

An object of the present invention is to solve the above problems and provide a semiconductor chip manufacturing method and a semiconductor wafer capable of dividing a wafer on which a TEG is formed into individual pieces of semiconductor chips by using plasma dicing, efficiently removing the TEG, and further increasing the number of semiconductor chips obtainable per wafer or expanding the device-formation-regions.

In order to achieve the above object, the present invention has the following constitutions.

According to a first aspect of the present invention, there is provided a manufacturing method for semiconductor chips comprising:

forming a semiconductor device in each of device-formation-regions defined by dividing regions and forming a TEG, or a test element group, in a TEG-placement portion, the dividing regions being arranged so as to include the TEG-placement portion where the TEG is arranged and region-width-reduced portions whose region widths are made smaller than that of the TEG-placement portion on a first surface of a semiconductor wafer;

sticking a protective sheet onto the first surface of the semiconductor wafer so that the sheet is brought in contact with the TEG;

placing a mask on a second surface which is a surface located opposite from the first surface of the wafer so as to define the dividing regions;

performing plasma etching on the second surface of the wafer in a state that the protective sheet is stuck to and the mask is placed on, thereby portions corresponding to the dividing regions are removed and then the device-formation-regions are divided into individual semiconductor chips each of which includes the individualized semiconductor device; and removing a remaining portion of the TEG, which remains in the TEG-placement portion and is stuck to the protective sheet, together with the protective sheet by peeling off the protective sheet from the semiconductor chips divided by the plasma etching, thereby the individualized semiconductor chips are manufactured.

According to a second aspect of the present invention, there is provided the manufacturing method for the semiconductor chips as defined in the first aspect, wherein in forming the semiconductor devices and the TEG, the dividing regions are arranged so as to include the regionwidth-reduced portions that have widths smaller than the width dimension of the TEG and the TEG-placement portion that has a width dimension greater than the width dimension of the TEG.

According to a third aspect of the present invention, there is provided the manufacturing method for the semiconductor chips as defined in the first aspect, wherein in forming the semiconductor devices and the TEG, the dividing regions are arranged so that the TEG-placement portion is arranged adjacent to a corner portion of the device-formation-regions.

According to a fourth aspect of the present invention, there is provided the manufacturing method for the semiconductor chips as defined in the first aspect, wherein the device-formation-regions are rectangular regions, the dividing regions include a plurality of first dividing regions for dividing mutually adjacent device-formation-regions in a first direction and a plurality of second dividing regions for dividing in a second direction perpendicular to the first direction as the region-width-reduced portions, and the dividing regions are arranged in a manner that the TEG-placement portion is formed by partially expanding widths of the first dividing regions and the second dividing regions so that corner portions of the device-formation-regions facing an at least one intersection of the first dividing regions and the second dividing regions are set back inward.

According to a fifth aspect of the present invention, there is provided the manufacturing method for the semiconductor chips as defined in the fourth aspect, wherein the first dividing regions and the second dividing regions have width dimensions smaller than the width dimension of the TEG, and the TEG-placement portions have width dimensions greater than the width dimension of the TEG.

According to a sixth aspect of the present invention, there is provided the manufacturing method for the semiconductor chips as defined in the fourth aspect, wherein the TEG-placement portion is formed so that the corner portions of the device-formation-regions facing the intersection become roughly curved convex surface portions.

According to a seventh aspect of the present invention, there is provided the manufacturing method for the semiconductor chips as defined in the fourth aspect, wherein the TEG-placement portion is formed by chamfering the corner portions of the device-formation-regions facing the intersection.

According to an eighth aspect of the present invention, there is provided a semiconductor wafer comprising:

a substrate that has a circuit-formation-face on which a plurality of device-formation-regions and dividing regions for defining the device-formation-regions are arranged;

a plurality of semiconductor devices placed in the device-formation-regions, respectively; and a TEG, or test element group, placed in a TEG-placement portion of the dividing regions, the dividing regions including the TEG-placement portion and region-width-reduced portions whose region widths are made smaller than that of the TEG-placement portion.

According to a ninth aspect of the present invention, there is provided the semiconductor wafer as defined in the eighth aspect, wherein the dividing regions are formed so as to include the region-width-reduced portions that have widths smaller than the width dimension of the TEG and the TEG-placement portion that has a width dimension greater than the width dimension of the TEG.

According to a tenth aspect of the present invention, there is provided the semiconductor wafer as defined in the eighth aspect, wherein the device-formation-regions are rectangular regions, the dividing regions include a plurality of first dividing regions for dividing mutually adjacent device-formation-regions in a first direction and a plurality of second dividing regions for dividing in a second direction perpendicular to the first direction as the region-width-reduced portions, and the TEG-placement portion, in which widths of the first dividing regions and the second dividing regions are partially expanded so that corner portions of the device-formation-regions facing an at least one intersection of the first dividing regions and the second dividing regions are set back inward.

According to the aspects of the present invention, by manufacturing semiconductor chips by dividing a semiconductor wafer where a TEG is formed in dividing regions into individual pieces in the respective device-formation-regions along the dividing regions, and by forming the dividing regions that include the TEG-placement portion where the TEG is placed and a region-width-reduced portion of which the region width is made smaller than the TEG-placement portion, the region width of the region-width-reduced portion can be determined by freely reducing the region width without being restricted by the TEG width. With this arrangement, the distance between the edge portions of mutually adjacent device-formation-regions can be reduced by reducing the region width of the region-width-reduced portion in the dividing region to the extent that the regions can be divided by plasma etching. Therefore, a semiconductor chip manufacturing method capable of reducing the area of the entire dividing regions, increasing the number of semiconductor chips obtainable per unit area or expanding the area of the device-formation-region on the semiconductor wafer can be provided.

Particularly, by setting a width dimension of the TEG-placement portion greater than a width dimension of the TEG in the dividing regions and arranging the dividing regions so that the region-width-reduced portions having width dimensions set smaller than the width dimension of the TEG is included, the widths of the dividing region in the portion where the TEG is not placed (i.e., widths of the region-width-reduced portions) can be made smaller than the width of the TEG, and the region area of the entire dividing regions can concretely be reduced.

Moreover, by expanding the widths of the first dividing regions and the second dividing regions at the intersection of the first and second dividing regions which are arranged in the mutually opposite directions, so that the corner portions of the device-formation-regions facing the intersection are set back, the TEG-placement portion can be formed and placed.

Moreover, the effects described above can similarly be obtained not only by the manufacturing method for the semiconductor chips but also in the semiconductor wafer where the semiconductor devices are formed in the respective device-formation-regions defined by the arrangement of the dividing regions and the TEG is formed on in the TEG-placement portion.

Moreover, the TEG, which is formed in the dividing regions during the semiconductor chip manufacturing process for characteristic investigation, are formed of the materials of silicon and silicon oxide that are the objective materials to be etched by the plasma etching and also of a material that contains, for example, a metal or an inorganic substance different from the materials. Therefore, as a solution to the conventional problem that the TEG cannot be removed depending on the plasma etching for the individualization of the semiconductor chips, by separating the TEG from the respective semiconductor chips by performing the plasma etching and subsequently peeling off the protective sheet for a protection purpose stuck to the first surface of the semiconductor wafer from the surface, the TEG that is adhering to the protective sheet in contact with the sheet can be removed from the dividing regions located between the respective semiconductor chips.

Therefore, even when the semiconductor wafer is subjected to the dividing process by the plasma etching, it is possible to obviate the need for performing the plasma etching for the removal of the TEG and thus obviate the need to change the gas type because the TEG can be removed by merely peeling off the protective sheet, thereby allowing the removal of the TEG to be achieved through efficient operation.

BRIEF DESCRIPTION OF DRAWINGS

These and other aspects and features of the present invention will become clear from the following description taken in conjunction with the preferred embodiments thereof with reference to the accompanying drawings, in which:

FIG. 6 is a flow chart showing the steps of the manufacturing method for the semiconductor chips of the above embodiment;

FIG. 7A is a view showing a state in which a protective sheet is stuck to the semiconductor wafer;

FIG. 7B is a view showing a state in which a mask layer is formed on the semiconductor wafer;

FIG. 7C is a view showing a state in which the formed mask layer is processed to form mask patterns, and FIG. 7D is a view showing a state in which plasma dicing is performed;

FIG. 8A is a view showing a state in which the mask patterns are removed;

FIG. 8B is a view showing a state in which an adhesive sheet is adhesively placed, and FIG. 8C is a view showing a state in which TEGs are removed together with removal of the protective sheet;

DETAILED DESCRIPTION OF THE INVENTION

Figure 1:
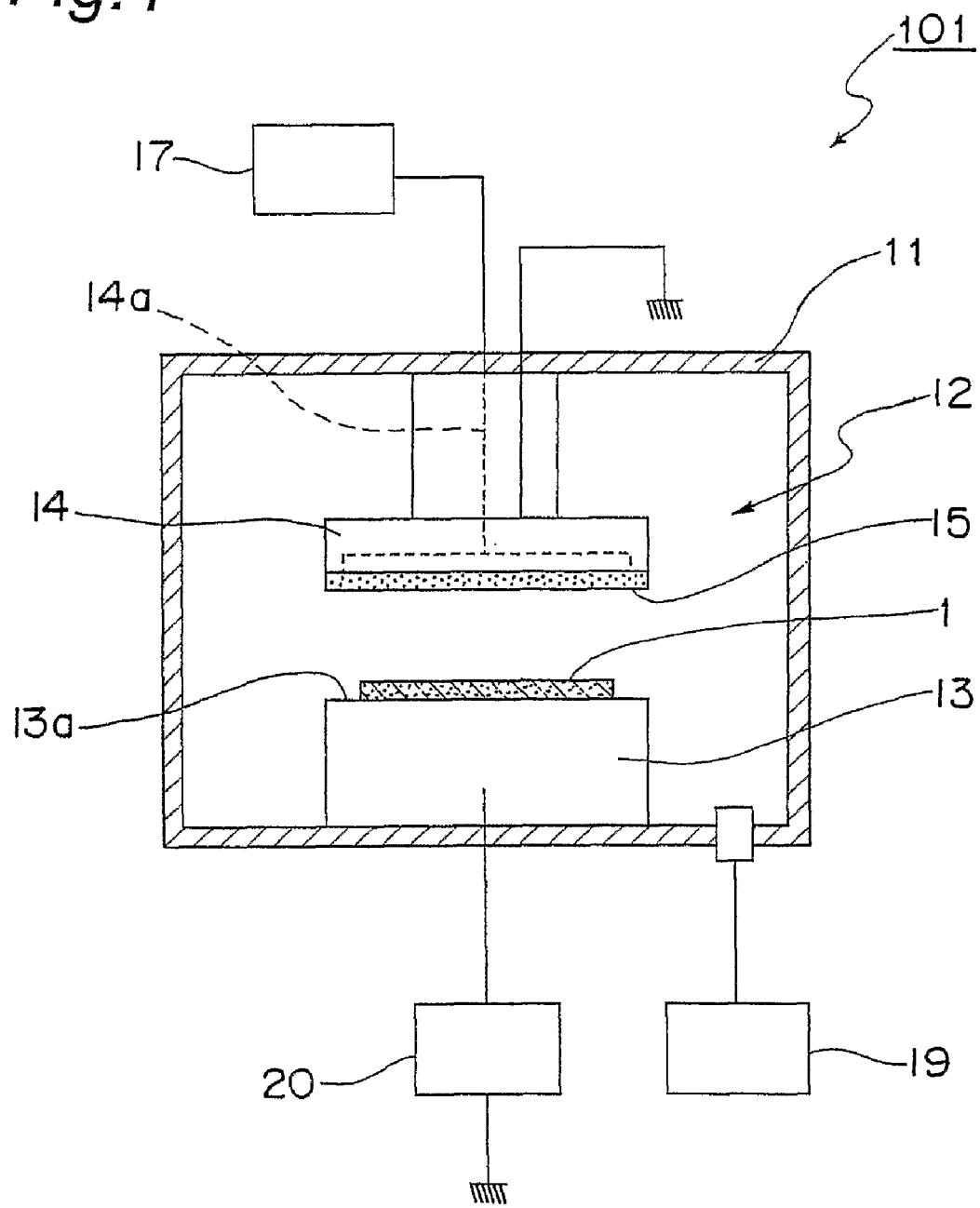
FIG. 1 is a schematic view showing the construction of a plasma processing apparatus according to one embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

In describing a manufacturing method for semiconductor chips according to one embodiment of the present invention, the constructions of the apparatus used for the manufacturing method is described first. A plasma processing apparatus 101 is one example of the semiconductor chip manufacturing apparatus that manufactures semiconductor chips by dividing a semiconductor wafer into a plurality of semiconductor chips. FIG. 1 shows a schematic structural view for schematically showing the construction of the plasma processing apparatus 101. The plasma processing apparatus 101 is the apparatus that performs plasma etching on a semiconductor wafer where semiconductor devices are formed in a plurality of device-formation-regions to thereby separate the device-formation-regions into individual pieces of semiconductor chips that include the respective semiconductor devices (plasma dicing process). The schematic construction of the plasma processing apparatus 101 is described below with reference to FIG. 1. As shown in FIG. 1, the plasma processing apparatus 101 has a vacuum vessel 11 that forms therein a processing chamber 12 of a sealed space for carrying out plasma processing on the semiconductor wafer 1. A lower electrode (first electrode) 13 and an upper electrode (second electrode) 14 are arranged in parallel and opposing each other in the vacuum vessel 11. Moreover, a placement surface 13a on which a roughly disk-shaped semiconductor wafer 1 can be placed is formed on the illustrated upper surface of the lower electrode 13. Moreover, the placement surface 13a has a function to releasably suck and hold the placed semiconductor wafer 1 by vacuum suction or electrostatic suction. The lower electrode 13 is placed in the vacuum vessel 11 via an insulator, and the lower electrode 13 and the vacuum chamber 11 are mutually electrically insulated by the insulator.

Moreover, a gas supply hole 14a, which is a passageway for supplying a gas for generating plasma, is formed penetrating the inside of the upper electrode 14 in a space (discharge space) formed between the upper electrode 14 and the lower electrode 13. Moreover, in the upper electrode 14, one end of the gas supply hole 14a formed communicating with the outside of the vacuum vessel 11 is connected to a plasma generation gas supply unit 17 provided outside the vacuum vessel 11 and allows a fluorine based plasma generation gas containing, for example, carbon tetrafluoride ($CF_4$), sulfur hexafluoride ($SF_6$) or the like to be supplied from the plasma generation gas supply unit 17 into the processing chamber 12 through the gas supply hole 14a. It is noted that a gas flow rate regulating unit (not shown) that regulates the flow rate of the supplied gas to the desired flow rate is provided partway at the gas supply passage located between the plasma generation gas supply unit 17 and the one end of the gas supply hole 14a. Further, a porous plate 15 is provided on the illustrated lower surface of the electrode 14, and the plasma generation gas supplied through the gas supply hole 14a can be supplied into the processing chamber 12 so that the gas is uniformly applied to the semiconductor wafer 1 placed on the placement surface 13a of the lower electrode 13 via the porous plate 15.

Moreover, the plasma processing apparatus 101 has an evacuation pump 19 of one example of the evacuation device that reduces the internal pressure (i.e., evacuates) the processing chamber 12 to the desired pressure by evacuating the inside of the processing chamber 12. Moreover, a radio-frequency power supply unit 20 is electrically connected to the lower electrode 13, allowing a radio-frequency voltage to be applied to the lower electrode 13 by the radio-frequency power supply unit 20.

In the plasma processing apparatus 101 of the above construction, by placing the semiconductor wafer 1 on the placement surface 13a of the lower electrode 13, sealing the vacuum vessel 11, thereafter evacuating the inside of the processing chamber 12 by the evacuation pump 19 to produce a vacuum, and applying the radio-frequency voltage to the lower electrode 13 by driving the radio-frequency power supply unit 20 in a state in which a prescribed amount of plasma generation gas is supplied from the plasma generation gas supply unit 17 into the processing chamber 12, a fluorine based plasma can be generated in the discharge space between the upper electrode 14 and the lower electrode 13. By applying the thus-generated plasma to the surface of the semiconductor wafer 1, the surface to which the plasma is applied can be etched (i.e., plasma etching is performed).

The semiconductor wafer 1 subjected to a plasma dicing process and the like in the plasma processing apparatus 101 is described next. For aiding explanation, FIG. 2 shows a schematic plan view of a circuit-formation-face (first surface or device-formation-region surface) 1a of the semiconductor wafer 1 on which the semiconductor devices are formed.

Figure 2:
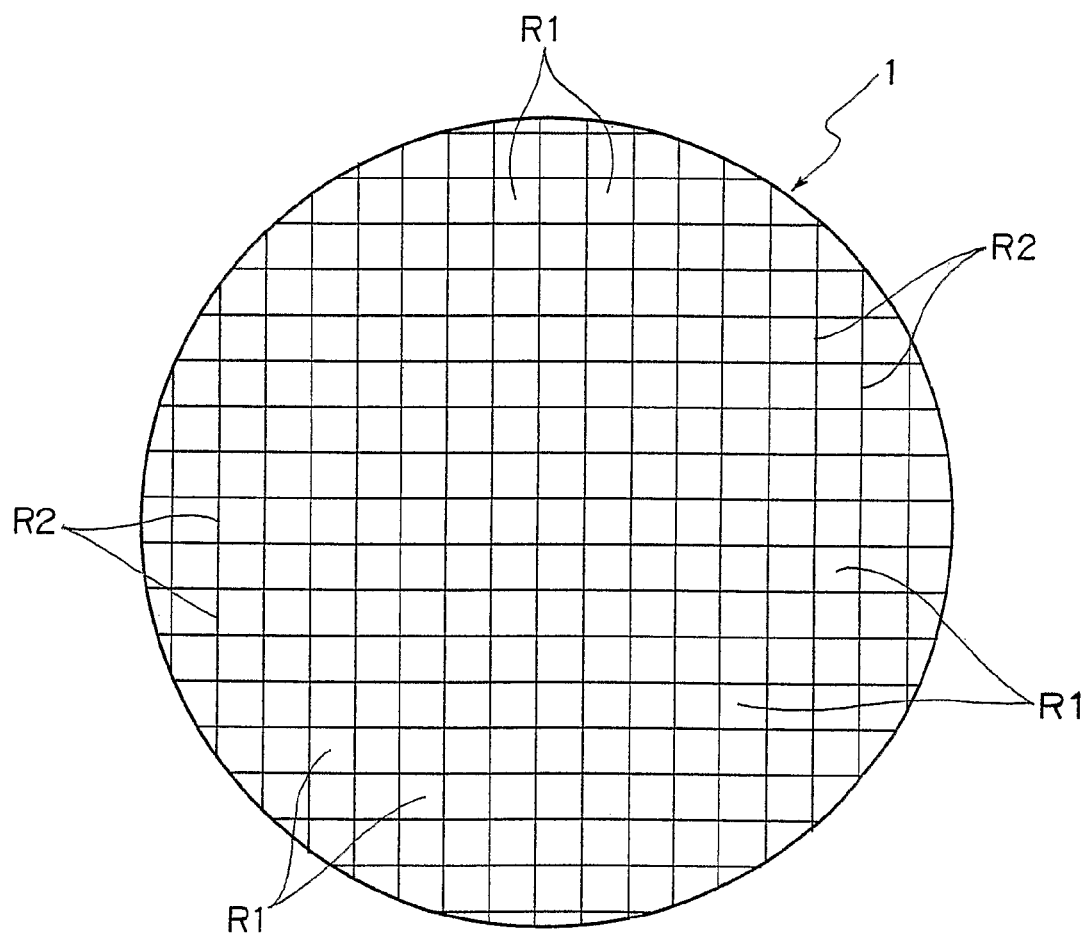
FIG. 2 is a schematic plan view of a semiconductor wafer handled in the above embodiment.

As shown in FIG. 2, a plurality of device-formation-regions R1 is arranged in a matrix form on the circuit-formation-face 1a of the semiconductor wafer 1. The device-formation-regions R1 have a size determined according to the size of the semiconductor chips to be manufactured and are arranged in, for example, rectangular regions. In this case, FIG. 3 shows a partially enlarged schematic plan view of the circuit-formation-face 1a of the semiconductor wafer 1, and FIG. 4 shows a schematic sectional view taken along the line A-A of the semiconductor wafer 1 of FIG. 3.

Figure 3:
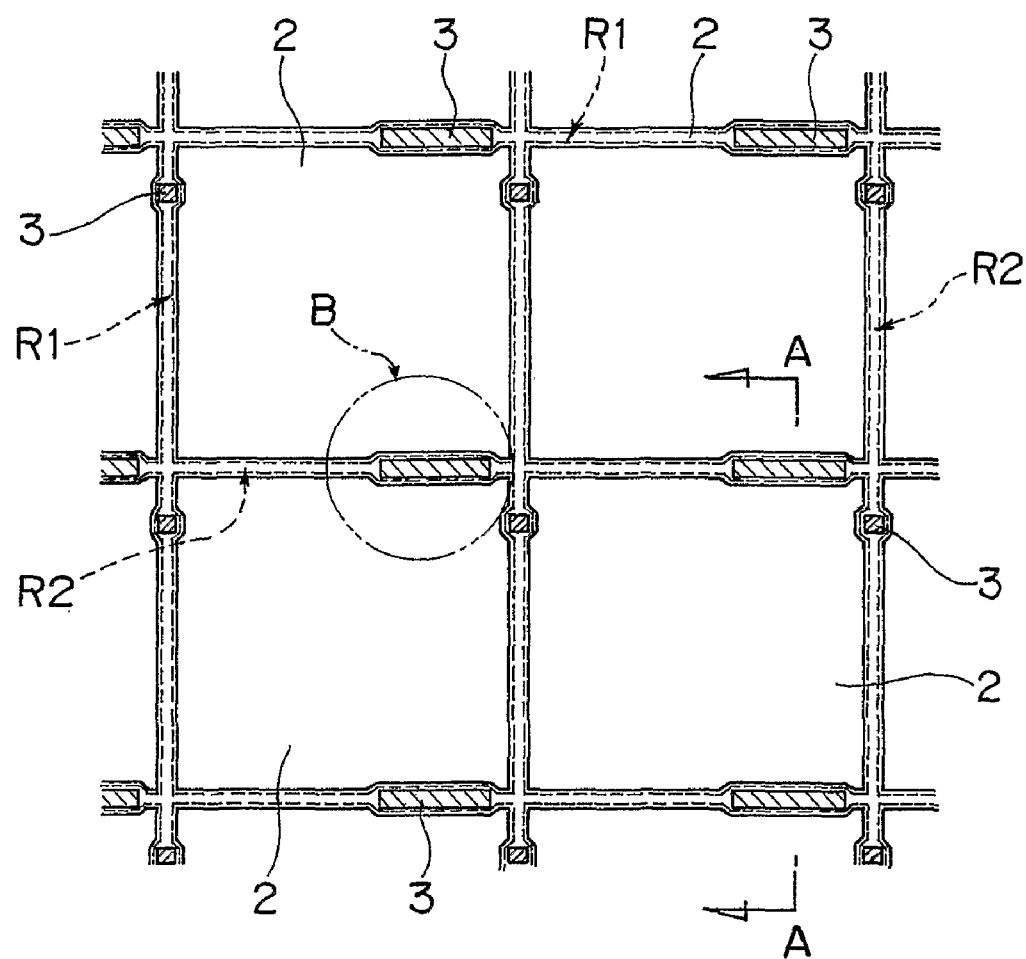
FIG. 3 is a partially enlarged schematic plan view of the semiconductor wafer of FIG. 2.

As shown in FIG. 3, dividing regions R2, which are roughly linear (belt-shaped) regions that have a prescribed width dimension (i.e., a region that has a width dimension sufficiently smaller than that in the lengthwise direction thereof), are arranged between the mutually adjacent device-formation-regions R1. The dividing regions R2 serve as the regions that are arranged in a roughly grating-like shape on the circuit-formation-face 1a of the semiconductor wafer 1 defining the device-formation-regions R1 and also serve as the frame-shaped regions arranged outside the peripheries of the device-formation-regions R1 with regard to the relation thereof to one device-formation-region R1. Further, the dividing regions R2 are located in dividing positions where the device-formation-regions R1 are separated into individual pieces in the plasma dicing processing described later. Moreover, each of the semiconductor devices 2 is formed in each of the device-formation-regions R1.

Figure 4:
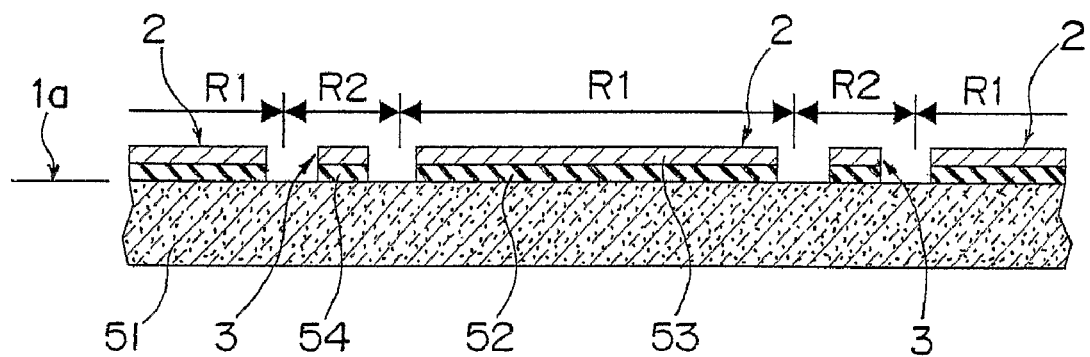
FIG. 4 is a sectional view taken along the arrow line A-A of the semiconductor wafer of FIG. 3.

In concrete, as shown in FIG. 4, the semiconductor wafer 1 is formed of a silicon substrate 51 that has a disk-like shape, and the semiconductor devices 2 are each formed by forming a device layer 53 via a silicon oxide 52 in a portion that corresponds to each device-formation-region R1 on the circuit-formation-face 1a. Moreover, TEGs 3, that is, "TEG" means "a Test Element Group", are formed in portions that correspond to the dividing regions R2 arranged between the mutually adjacent device-formation-regions R1 via a silicon oxide 54 on the circuit-formation-face 1a of the semiconductor wafer 1. Here, the TEG is the test patterns, which are designed in conformity to applications so that the characteristics and the shapes necessary for tests can be evaluated and arranged in places other than the device patterns when it is difficult to test the patterns on the actual devices and serves as the assembly of a plurality of patterns (test elements). Moreover, the TEG is the evaluation device, which is formed through the semiconductor chip manufacturing processes and formed of the materials of silicon and silicon oxide and also of a material that contains a metal or an inorganic substance different from the materials. For example, the TEG 3 is formed of a material similar to that of the device layer 53 of the semiconductor device 2, the material being exemplified by Al, AlSi, Al—Si—Cu or the like.

Moreover, as shown in FIGS. 3 and 4, the silicon oxide 52 in each device-formation-region R1 and the silicon oxide 54 in each dividing region R2 are formed separated from each other. That is, the semiconductor devices 2 and the TEGs 3 are formed separated from each other, and, for example, minute spaces where no silicon oxide exists are existing between both of them. Moreover, for example, as shown in FIG. 3, the thus-formed TEGs 3 have various shapes, including those that have a roughly square planar shape and those that have a rectangular planar shape extending along the lengthwise direction of the dividing region R2.

Figure 5:
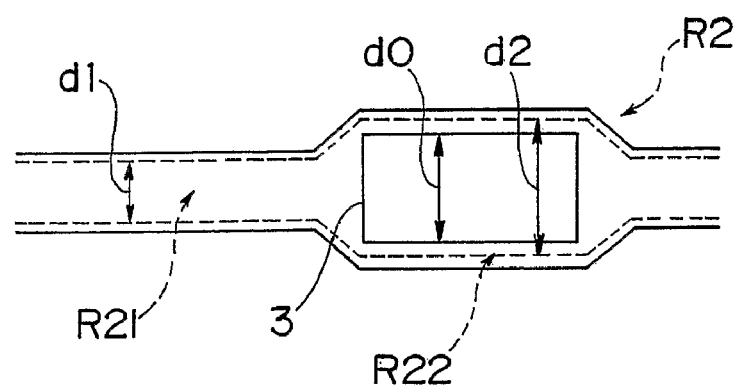
FIG. 5 is an enlarged schematic view of a portion B of the semiconductor wafer of FIG. 3.

In this case, FIG. 5 shows an enlarged schematic view of the portion B of the dividing region R2 where a TEG 3 shown in FIG. 3 is formed. As shown in FIG. 5, the dividing region R2, which is a roughly linear (or roughly belt-shaped) region, has a TEG-placement portion R22 that is the region where the TEG 3 is placed and a region-width-reduced portion (or region-width-narrowed portion) R21 of which the region width is reduced with respect to the region width of the TEG-placement portion R22, and the dividing region R2 is formed as an integrated region by combining these regions of two types.

Moreover, as shown in FIG. 5, the width dimension d2 of the TEG-placement portion R22 is greater than the width dimension d0 of the TEG 3, and conversely, the width dimension d1 of the region-width-reduced portion R21 is smaller than the width dimension d0 of the TEG 3. By thus forming the TEG-placement portion R22, the TEG 3 can be placed in the TEG-placement portion R22, and the distance between the edge portions of the device-formation-regions R1 placed via the region-width-reduced portion R21 can be set short. As shown in FIG. 3, the dividing regions R2, which are arranged roughly in a matrix form (i.e., arranged in the lengthwise direction and the sidewise direction), are integrally formed by combining, for example, a plurality of TEG-placement portions R22 and a plurality of region-width-reduced portions R21, and the TEG 3 is placed in each of the respective TEG-placement portions R22. Moreover, as shown in FIG. 3, when a plurality of kinds of the TEGs 3 of different shapes and sizes are formed on the semiconductor wafer 1, a plurality of kinds of the TEG-placement portions R22 are formed in accordance with the shapes and sizes of the respective TEGs 3. Moreover, since the region width of the TEG-placement portion R22 is expanded with respect to that of the region-width-reduced portion R21, the portion can also be referred to as a region-width-expanded portion (or a wide-region-width portion).

Moreover, by thus forming the TEG-placement portion R22 in the dividing region R2, the device-formation-region R1 defined by the dividing region R2 is to be formed so that the roughly rectangular outer peripheral edge portion thereof is partially set back inward. Although the shape of the outer peripheral edge portion of the semiconductor device 2 formed in the device-formation-region R1 needs to be conform to the partially setback shape, no particular problem occurs because of the fact that the TEG 3 itself is sufficiently smaller than the semiconductor device 2 and the fact that the shape of the edge portion of the semiconductor device 2 sufficiently tolerates a deformation to a certain extent by the arrangement of a circuit to be formed in the device. The arrangement of the device-formation-regions R1 and the dividing regions R2 can be determined by setting, for example, the width dimensions d1 of the device-formation-regions R1 to 1 to 20 mm, setting the width dimensions d2 of the TEG-placement portions R22 to 30 to 50 μm, setting the width dimensions d1 of the region-width-reduced portions R21 to 5 to 20 μm and setting the width dimensions d0 of the TEGs 3 to 20 to 30 μm in FIGS. 4 and 5. Moreover, in FIG. 3, for example, the roughly rectangular TEGs 3 can be formed to have length dimensions of about several hundred micrometers, and the roughly square TEGs 3 can be formed to have dimensions of about 1 to 20 μm square.

Next, a sequence of semiconductor chip manufacturing processes is described below including the dividing process of the semiconductor wafer 1 carried out by using the plasma processing apparatus 101 of the above construction. For aiding explanation, FIG. 6 shows a flow chart showing the procedure of the semiconductor chip manufacturing processes, and FIGS. 7A through 7D and FIGS. 8A through 8C show schematic explanatory views for explaining the procedure.

First of all, in step S1 of the flow chart of FIG. 6, the arrangement of the device-formation-regions R1 and the dividing regions R2 are determined on the circuit-formation-face 1a of the semiconductor wafer 1 (region arrangement determining process). As shown in FIGS. 3 and 5, the size of the device-formation-regions R1 is determined according to the size of the semiconductor devices 2 to be formed. The region-width-reduced portions R21 are arranged by the width dimension d1 calculated on the basis of the width dimension of the dividing region 3 necessary for dividing adjacent device-formation-regions R1 by plasma dicing described later. The TEG-placement portions R22 are arranged on the basis of the width dimensions d0 and the sizes (e.g., length dimensions in the lengthwise direction etc.) of the TEGs 3 to be formed, determining the arrangement of the dividing regions R2. Through these processes, the arrangement of the device-formation-regions R1 and the arrangement of the dividing regions R2 that include the respective region-width-reduced portions R21 and TEG-placement portions R22 are determined on the semiconductor wafer 1. It is noted that the region arrangement determining process can be performed by executing, for example, a program for determining the arrangement by a calculation means of a computer or the like.

Next, by subjecting the circuit-formation-face 1a of the semiconductor wafer 1 to the processes of film formation, exposure, etching and so on as shown in FIG. 4 on the basis of the arrangement data of the regions R1 and R2 determined as described above, the semiconductor devices 2 are formed in the respective device-formation-regions R1 (step S2: semiconductor device forming step). Moreover, TEGs 3 are formed in the respective TEG-placement portions R22 of the dividing regions R2 through the semiconductor device forming process. The semiconductor wafer formed as described above is the semiconductor wafer 1 shown in FIGS. 2 and 3. In the process of the semiconductor device forming process as described above, various characteristics of the formed semiconductor devices 2 are inspected by using the TEGs 3 (inspection process).

Figure 7A:
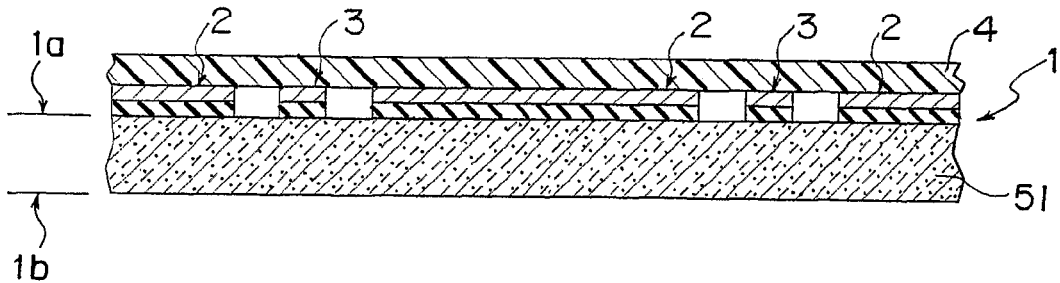
FIGS. 7A through 7D are schematic explanatory views for explaining the steps of the flow chart of FIG. 6: where

Next, as shown in FIG. 7A, a protective sheet 4 is peelably stuck to the circuit-formation-face 1a via an adhesive so that the circuit-formation-face 1a of the semiconductor wafer 1, which have completely undergone the inspection process, does not suffer damages during the processing subsequently carried out (step S3: protective sheet sticking process). Due to the semiconductor devices 2 and the TEGs 3 formed on the circuit-formation-face 1a, the protective sheet 4 is to be stuck onto the illustrated upper surfaces of the semiconductor devices 2 and the TEGs 3. It is noted that the protective sheet 4 to be used is shaped roughly into the same shape as that of the external shape of the semiconductor wafer 1 so as to cover the entire surface of the circuit-formation-face 1a and does not protrude outwardly of the edge portion of the semiconductor wafer 1. By using the protective sheet 4 of the shape described above, the possible occurrence of the protective sheet 4 protruding from the semiconductor wafer 1 being burnt by the plasma during the subsequent processing of, for example, plasma processing can be prevented.

Figure 7B:
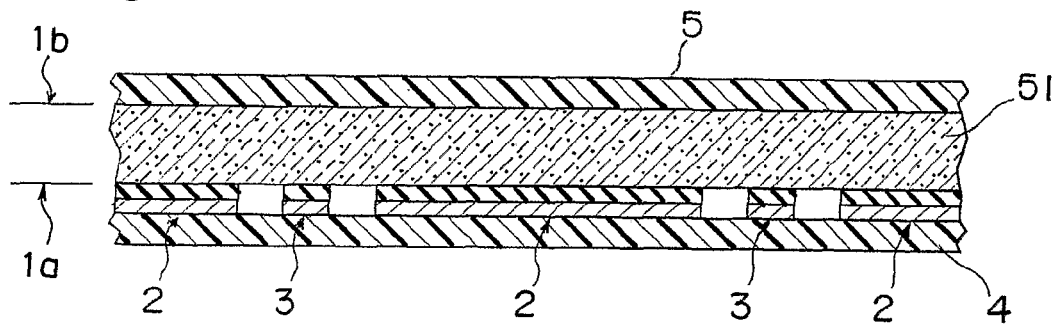

Next, in step S4 of FIG. 6, a mask layer 5 is formed on a processing-target-face 1b that is the surface (second surface) located opposite from the circuit-formation-face 1a of the semiconductor wafer 1 (step S4: mask layer forming process). The mask layer 5 is to form a mask patterns to be used in the plasma dicing processing described later and is formed of a material that has a resistance to the plasma of a fluorine based gas, the material being, for example, aluminum or a resin (e.g., photosensitive resist). FIG. 7B shows a state in which the circuit-formation-face 1a and the processing-target-face 1b are inverted with respect to the semiconductor wafer 1 shown in FIG. 7A. Although the case where the mask layer forming process is carried out after the protective sheet sticking process is described in the present embodiment, it may be a case where a thickness reducing process for reducing the thickness of the semiconductor wafer 1 is carried out between both the processes instead of the above case.

When aluminum is used, a method for forming an aluminum thin film on the processing-target-face 1b by a deposition process, a method for sticking a foil-shaped aluminum thin film or the like is used. Moreover, when a resin is used, a method for sticking a resin formed in a film-like shape, a method for forming a mask layer by applying a resin in a liquid form onto the processing-target-face 1b by a spin coating method or the like and thereafter additionally carrying out a baking process or the like can be used.

Figure 7C:
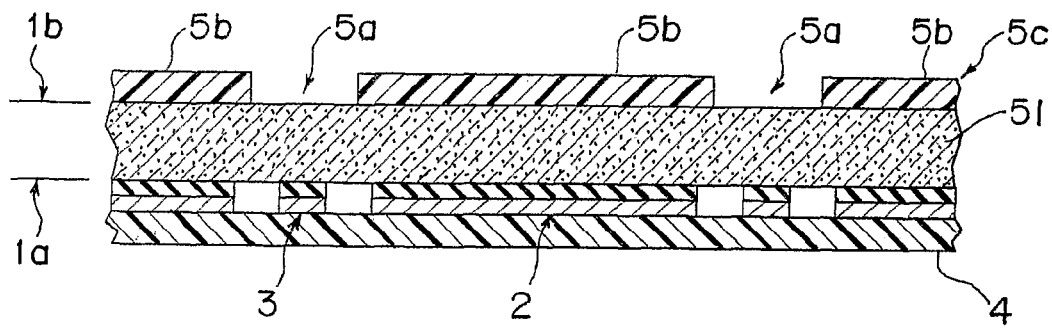

Next, as shown in FIG. 7C, the mask layer 5 is partially removed by laser processing to form the desired mask pattern (step S5: mask pattern forming process). The partial removal of the mask layer 5 can be achieved by using, for example, a laser beam and applying the laser beam to the mask layer 5 on the basis of the preset desired patterns. Moreover, patterns such that the mask layer 5 arranged in portions that correspond to the dividing regions R2 of the semiconductor wafer 1 is removed is formed as the desired patterns. Particularly, the dividing region R2 is to have shapes of different width dimensions depending on the places due to the existence of the region-width-reduced portion R21 and the TEG-placement portion R22. The mask layer 5 is removed in conformity to the shapes for the formation of the desired mask patterns.

Figure 12:
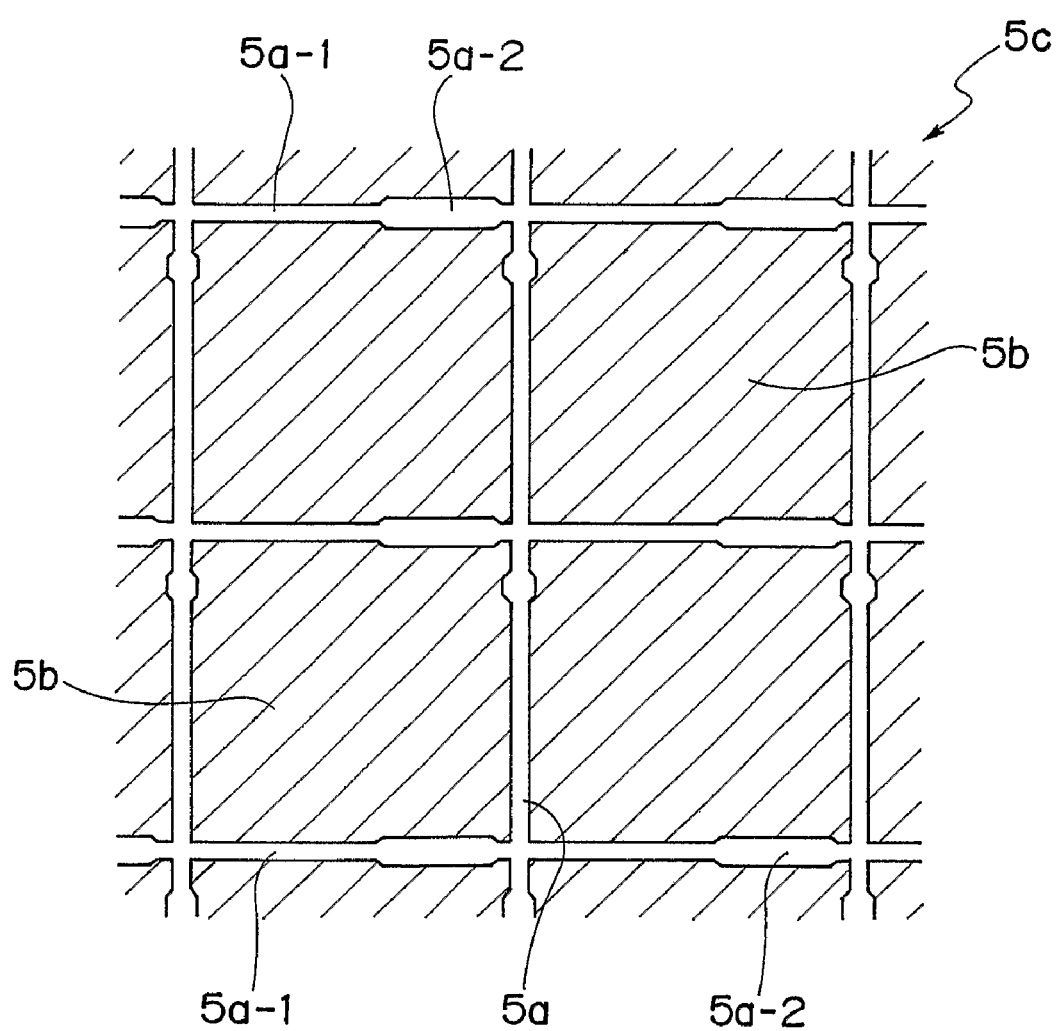
FIG. 12 is a schematic view of the mask patterns of the above embodiment.

Moreover, mask removal portions 5a for the dividing lines are formed by partially removing the mask layer 5 in the portions that correspond to the dividing regions R2 as shown in FIG. 7C by carrying out the mask pattern forming process. Moreover, masks 5b are formed of the remaining mask layer 5 from which the mask removal portions 5a have been removed, and mask patterns 5c are formed of the masks 5b and the mask removal portions 5a. Here, FIG. 12 shows a planar schematic view of the thus-formed mask patterns 5c. FIG. 12 is a view showing only the mask patterns 5c taken out of the semiconductor wafer 1, and the portions of the mask 5b is hatched. As shown in FIG. 12, mask removal portions 5a-2 for the TEG-placement portions that have shapes corresponding to the shapes of the TEG-placement portions R22 and mask removal portions 5a-1 for the region-width-reduced portions that have shapes corresponding to the shapes of the region-width-reduced portions R21 are formed in the mask patterns 5c, with which dividing line mask removal portions 5a are integrally formed. Moreover, such a combinational process of the mask layer forming process of step S3 and the mask pattern forming process of step S4 serves as a mask forming process (step S10). When the mask layer 5 is formed of a photosensitive resin, a method for forming the mask patterns through exposure and development can also be adopted. Moreover, it may be a case where a sheet-shaped mask 5b on which the mask patterns 5c are formed is placed on the processing-target-face 1b of the semiconductor wafer 1, instead of the case where the mask patterns 5c are formed by processing the mask layer 5 as described above.

Next, a method for forming individual pieces of semiconductor chips 10 including the semiconductor devices 2 by individually separating the device-formation-regions R1 by performing plasma etching on the semiconductor wafer 1 on which the mask patterns 5c have been thus formed is described (step S6: plasma dicing process (or plasma etching process)).

In the plasma processing apparatus 101 shown in FIG. 1, the semiconductor wafer 1 is placed on the placement surface 13a of the lower electrode 13 via the protective sheet 4 with the processing-target-face 1b on which the mask patterns 5c are formed served as the upper surface. Subsequently, the vacuum vessel 11 is sealed, and the processing chamber 12 is internally vacuumed (e.g., about 100 Pa) by driving the evacuation pump 19. In addition, the gas of the regulated flow rate is supplied from the plasma generation gas supply unit 17 into the processing chamber 12 through the gas supply hole 14a and the porous plate 15. By applying a radio-frequency voltage to the lower electrode 13 by the radio-frequency power supply unit 20 in the above state, plasma can be generated in a discharge space located between the upper electrode 14 and the lower electrode 13.

The plasma generated in the discharge space is applied to the mask patterns 5c formed on the processing-target-face 1b of the semiconductor wafer 1 placed on the placement surface 13a of the lower electrode 13. By the plasma application, the plasma is applied to the surface of the processing-target-face 1b that corresponds to the dividing line mask removal portions 5a, or the exposed surface on which the mask 5b is not placed. By thus applying the plasma, the exposed surface of the processing-target-face 1b is etched.

Figure 7D:
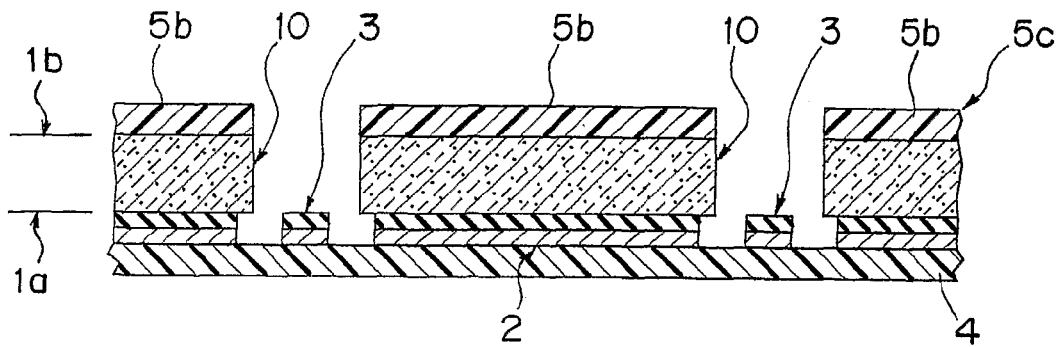

By performing the plasma etching on the exposed surface of the processing-target-face 1b of the semiconductor wafer 1, the semiconductor wafer 1 is reduced in thickness in the portion that corresponds to the exposed surface, and the portion is finally removed. Through this process, as shown in FIG. 7D, the semiconductor wafer 1 is divided into individual pieces of the semiconductor chips 10 including the semiconductor devices 2 along the dividing regions R2.

Moreover, a plurality of the region-width-reduced portions R21 and the TEG-placement portions R22 are formed in the dividing regions R2, and there are connecting portions between the portions R21 and R22, the connecting portions are portions for connecting the portions R21 and R22 which have different region widths each other. By using the plasma etching as the dividing means, the device-formation-regions R1 can be divided according to the configuration of the connecting portions.

For the plasma etching, for example, fluorine based plasma is used intending to remove the silicon and the silicon oxide. However, a reduced etching rate results with the TEGs 3 that are formed mainly of the material including metals and inorganic substances in the case of the etching using the fluorine based plasma, and therefore, the TEGs 3 remain unremoved (or other portion remains as a remaining portion as a consequence of the partial removal of the TEGs 3). Therefore, after the plasma etching is performed, as shown in FIG. 7D, only the TEGs 3 remain separated from the semiconductor chips 10 in the space between the semiconductor chips 10 separated into individual pieces, i.e., in the portion that corresponds the dividing regions R2, in this case, the TEG-placement portions R22. That is, the separation of the device-formation-regions R1 is achieved by performing the plasma etching, and the TEGs 3, which have been formed on the surface of the silicon substrate 51, are formed into individual pieces separated from the silicon substrate 51 as a consequence of removing its portion where the TEGs have adhered to the silicon substrate 51. Therefore, the plasma dicing process is carried out by using the mask pattern 5c formed capable of concurrently carrying out the separation of the semiconductor chips 10 and the individualization of the TEGs 3.

Figure 8A:
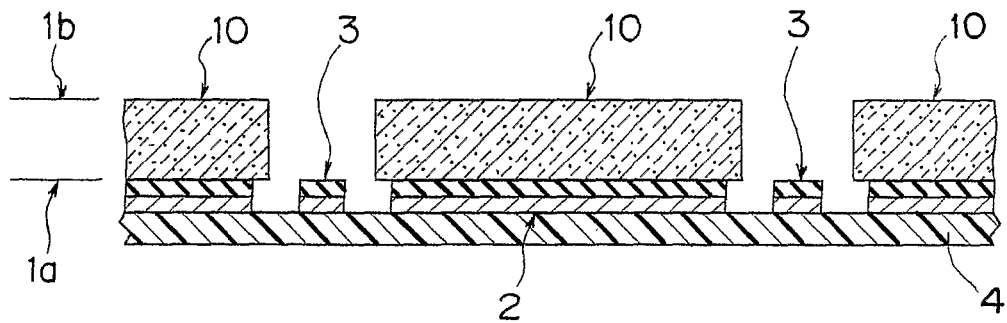
FIGS. 8A through 8C are schematic explanatory views continued from FIG. 7D for explaining the steps of the flow chart of FIG. 6: where

Subsequently, as shown in FIG. 8A, the mask 5b that remains unremoved on the processing-target-face 1b of each of the separated semiconductor chips 10 is removed by carrying out, for example, an asking process (step S7: mask layer removing process). Since the TEGs 3 are generally formed of a plurality of kinds of materials, the TEGs 3 are not removed even by the execution of the mask layer removing process and remain unremoved.

Figure 8B:
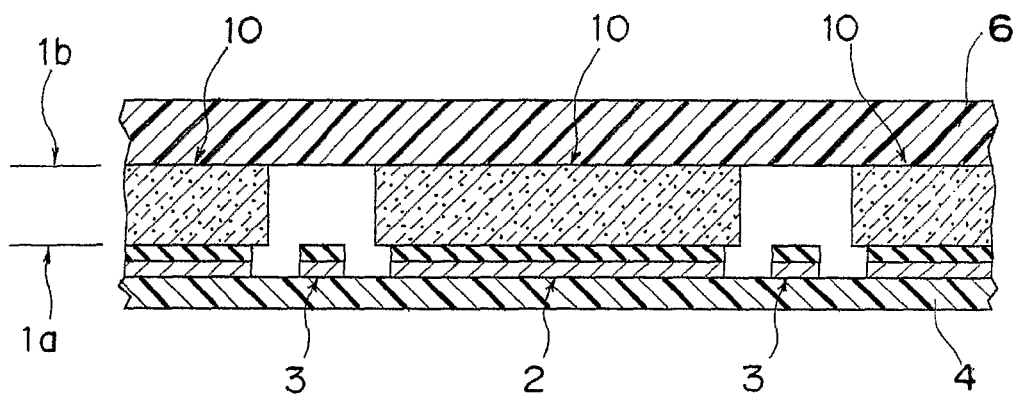

Subsequently, as shown in FIG. 8B, an adhesive sheet (dicing sheet) 6 is stuck to the processing-target-face 1b of the semiconductor wafer 1 (step S8: dicing sheet sticking process). The adhesive sheet 6 has a size larger than that of the semiconductor wafer 1 and is fixed by a wafer ring (jig) (not shown) located at its periphery to hold the wafer ring, thereby allowing the semiconductor wafer 1 to be handled.

Figure 8C:
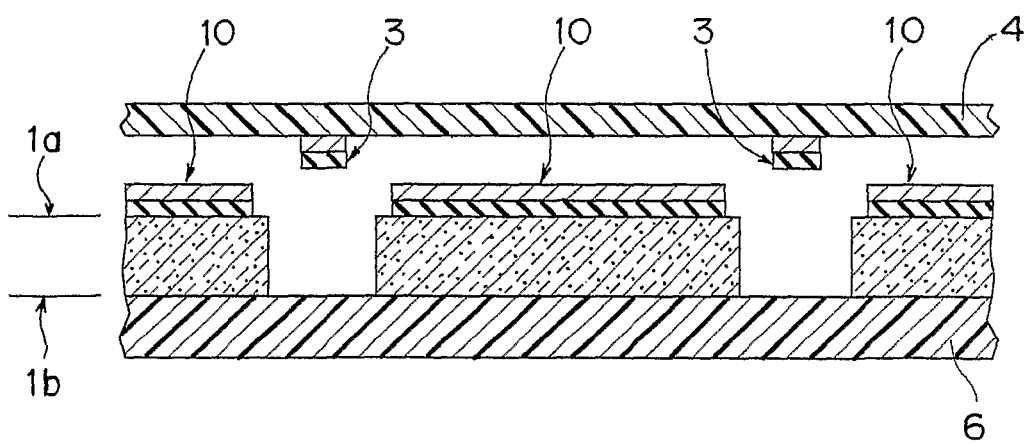

Subsequently, as shown in FIG. 8C, the protective sheet 4 that has protected the circuit-formation-face 1a of the semiconductor wafer 1 is peeled off. During the peeloff, the TEGs 3 that individually remain in the portions that correspond to the dividing region R2 (TEG-placement portions R22) are put in a state in which they are supported only by protective sheet 4, i.e., stuck to the surface of the protective sheet 4. Therefore, the TEGs 3 are removed from the respective dividing regions R2 (TEG-placement portions R22) together with the peeloff of the protective sheet 4. The process of removing the TEGs 3 by peeling off the protective sheet 4 as described above can be referred to as a protective sheet removing process or a TEG removing process (step S9). Moreover, the operation of peeling off the protective sheet 4 may be carried out manually by an operator or carried out mechanically by a device of a robot or the like.

As a result, the semiconductor chips 10 are separated into individual pieces and arranged on the adhesive sheet 6 in a state in which no TEG 3 exists. The semiconductor chip manufacturing process is thus completed.

According to the manufacturing method of the semiconductor chips, the arrangement of the dividing regions R2 for forming the TEGs 3 is not limited only to the above case, and various other arrangement variations can be adopted. The arrangement variations of the TEGs 3 in the dividing regions R1 are described below.

Figure 9:
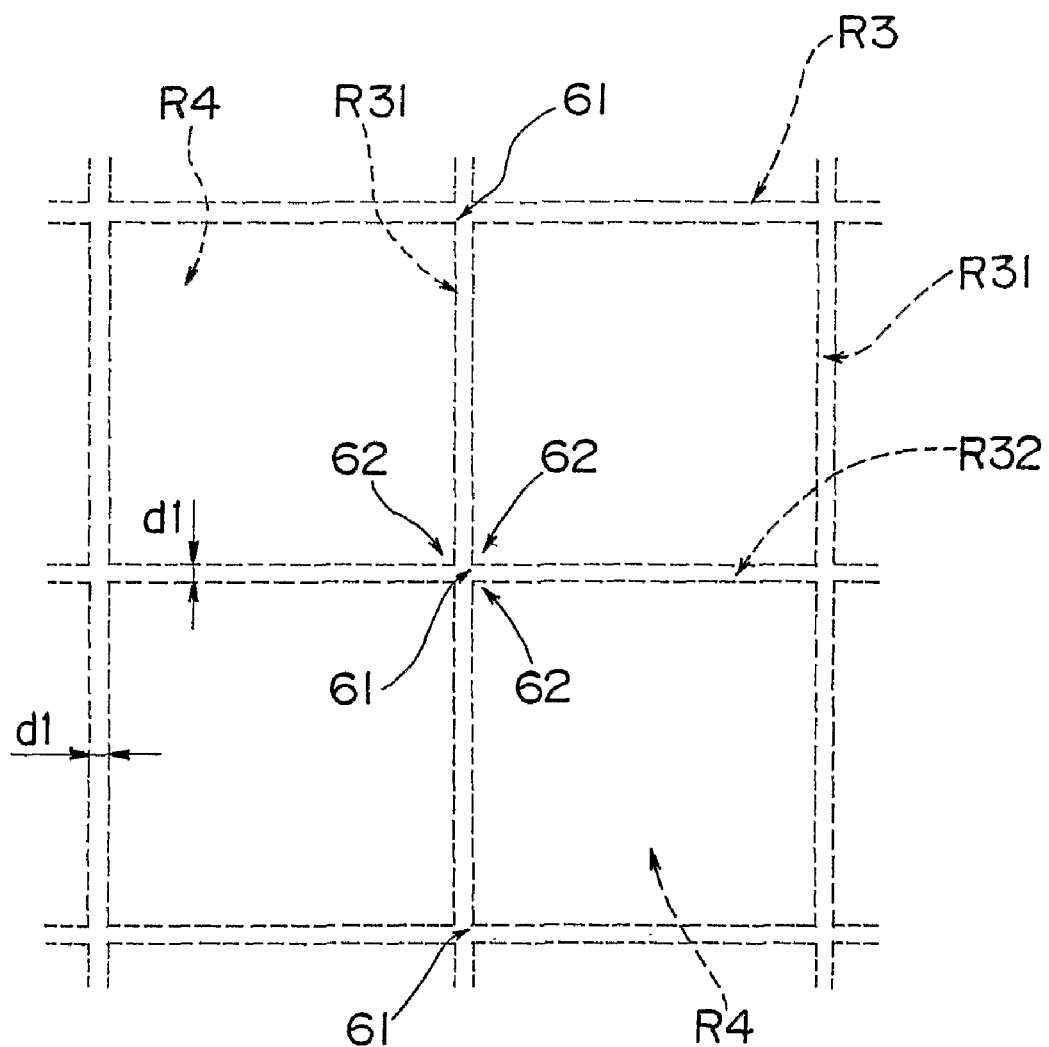
FIG. 9 is a partially enlarged schematic explanatory view of a semiconductor wafer for explaining an arrangement variation of device-formation-regions and dividing regions according to a modification example of the above embodiment.

First of all, FIG. 9 shows a partially enlarged schematic view of the dividing region R1 of the semiconductor wafer 1 for explaining an arrangement variation according to a first modification example. As shown in FIG. 9, a plurality of first dividing regions R31 that are roughly linear regions formed extending in the illustrated vertical direction, that is a first direction, in a direction along the surface of the semiconductor wafer 1 and a plurality of second dividing regions 32 that are roughly linear regions formed extending in the illustrated horizontal direction, that is a second direction, perpendicular to the first direction are arranged, for example, at regular interval pitches on the surface of the semiconductor wafer 1. By thus arranging the first dividing regions R31 and the second dividing regions R32, dividing regions R3 that have roughly grated frame configurations are formed, and the device-formation-regions R4 are defined by the dividing regions R3. The first dividing regions R31 and the second dividing regions R32 have width dimensions set as, for example, the width dimensions d1 smaller than the width dimensions d0 of the TEGs 3 and serve as one example of the region-width-reduced portions.

Figure 10:
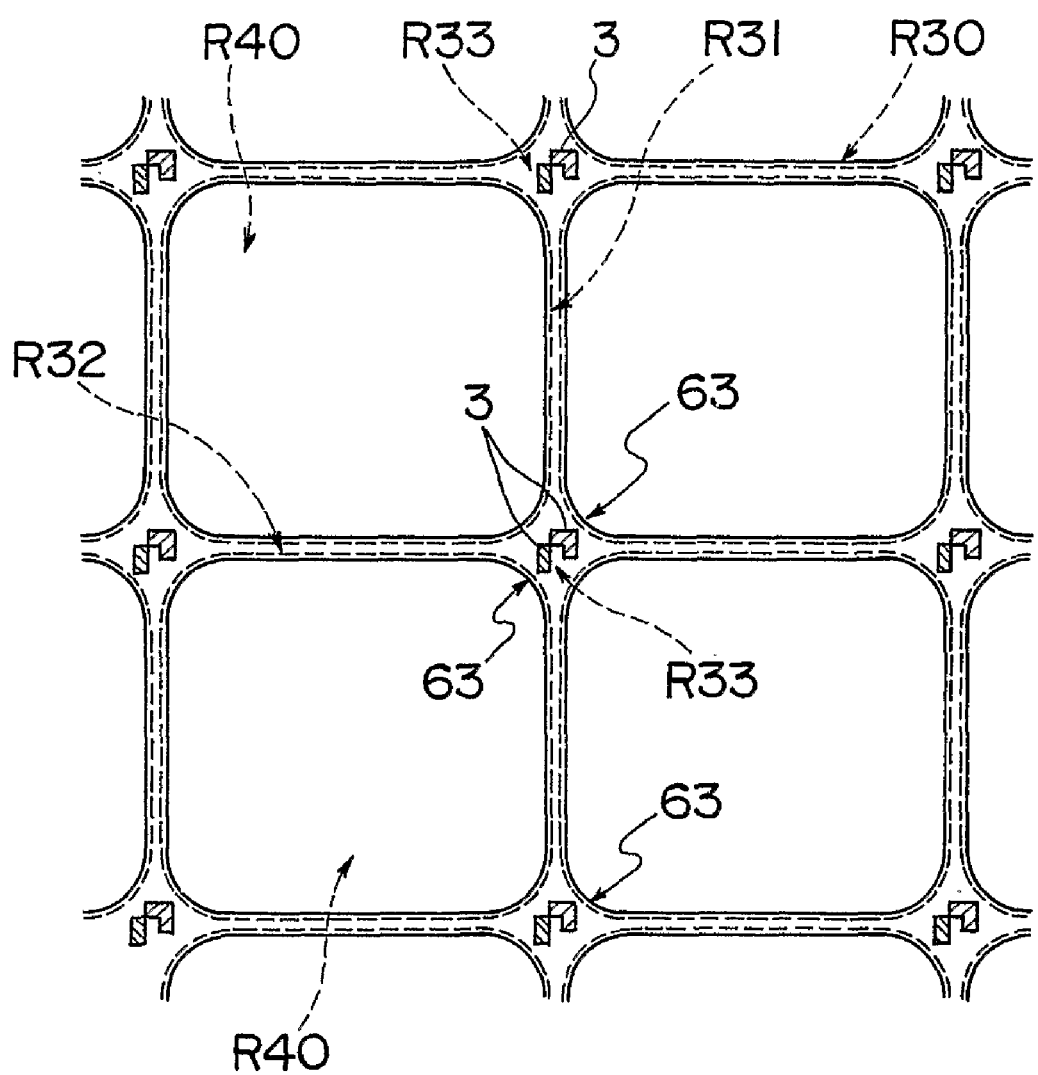
FIG. 10 is a partially enlarged schematic explanatory view of a semiconductor wafer for explaining an arrangement variation according to the modification example of FIG. 9.

By thus forming the dividing regions R3, a plurality of intersections 61 at which the first dividing regions R31 and the second dividing regions R32 mutually intersect are formed. In this case, corner portions 62 of mutually adjacent four device-formation-regions R4 face one another. By setting back the corner portions 62 inwardly of the device-formation-regions R4, the region area of the intersections 61 can be expanded (i.e., the region widths can be expanded) as shown in FIG. 10. The region widths are expanded so that the widths become greater than the width dimensions d0 of the TEGs 3. As a result, the intersections 61 can serve as TEG-placement portions R33, and the TEGs 3 can be arranged in the respective TEG-placement portions R33.

Moreover, by providing the setback so that the corner portions 62 of the device-formation-regions R4 come to have curved convex surface portions in expanding the region area of the intersections 61 as shown in FIG. 10, R-portions 63, that is rounded portions 63, can be formed at the corner portions 62. With this arrangement, the rectangular device-formation-regions R4 are formed into device-formation-regions R40 where the rounded portions 63 are formed at the corner portions 62. In the device-formation-regions R40 having the rounded portions 63, semiconductor devices 2 corresponding to the shape are to be formed in arrangement. The thus formed is the dividing region R30 where the TEG-placement portions R33 are arranged at the intersections 61 of the dividing region R3.

By thus adopting the variation of the region arrangement that TEGs 3 are placed by arranging the TEG-placement portions R33 at the intersections 61, the intersections 61 can effectively be utilized without forming the connecting portions in the side portions of the rectangular device-formation-regions R3. In particular, by conversely forming the corner portions into the rounded portions instead of making the connecting portions remain existing in the formed semiconductor chips, the transverse rupture strength of the semiconductor chips can be improved, and the semiconductor chips that are hard to damage can be provided.

Although the two TEGs 3 are placed in each TEG-placement portion R33 in FIG. 10, the number of TEGs 3 to be placed can freely be set. Moreover, when a plurality of TEGs 3 are placed in one TEG-placement portion R33 as described above, the size of the TEG-placement portion R33 is determined by grouping the plurality of TEGs 3 into one group and taking the size and the width dimension of the entire group into consideration.

Figure 11:
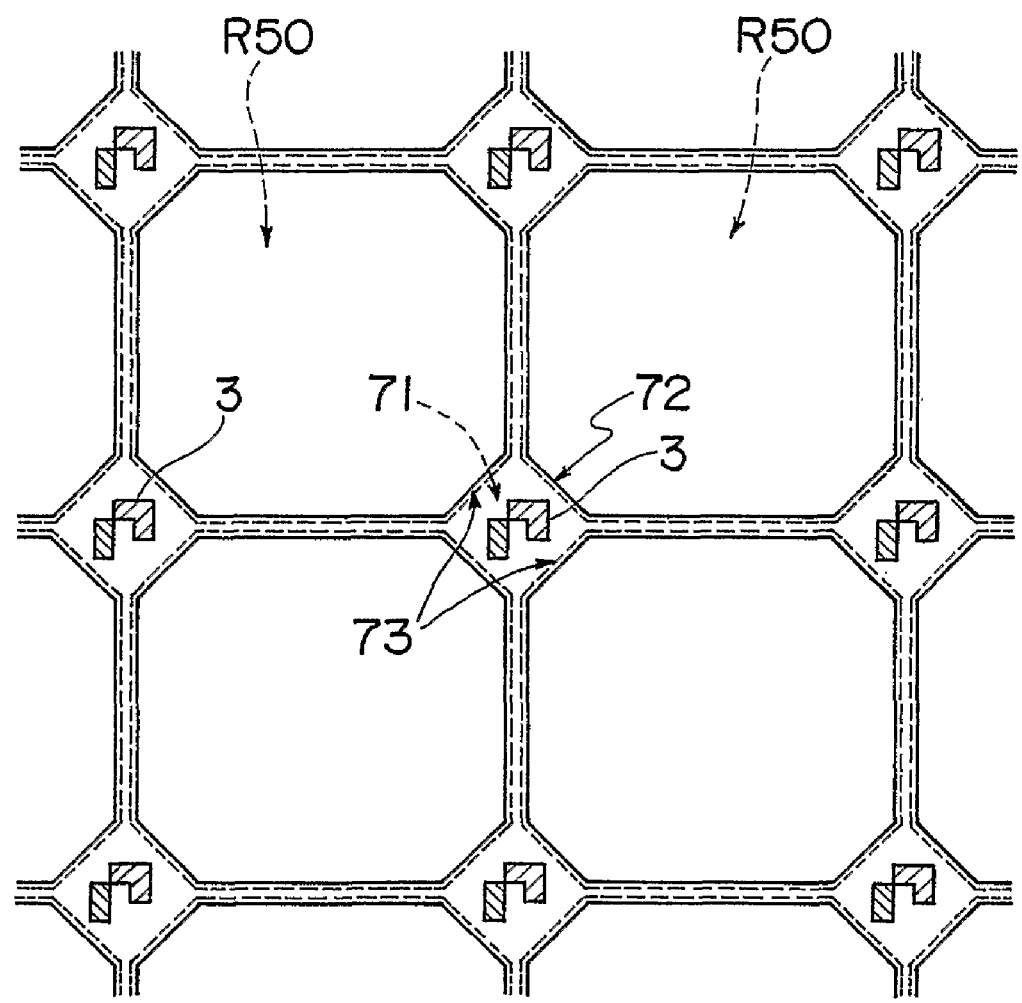
FIG. 11 is a partially enlarged schematic explanatory view of a semiconductor wafer for explaining an arrangement variation according to a further modification example of FIG. 10.

Moreover, although the TEG-placement portions R33 have been formed so that the rounded portions 63 are formed at the corner portions 62 of the device-formation-regions R40 according to the above description, other various shapes can be adopted with regard to the shape of the corner portions 62. For example, it may be a case where chamfered portions 73 are formed at corner portions 72 of device-formation-regions R50 as shown in FIG. 11. When the chamfered shape such that the edge portions of the corner portions 72 are linearly cut off is adopted as described above, there is an advantage that the region area of intersections 71 can be expanded more effectively than when the rounded portions 63 are formed.

Moreover, the arrangement of the device-formation-regions and the dividing regions as shown in FIGS. 10 and 11 can be defined by forming mask patterns that coincides with the arrangement, and the semiconductor wafer 1 on which the mask patterns are provided can be subjected to the plasma dicing process.

According to the embodiment, by determining the arrangement of the dividing regions R2 by combining the TEG-placement portions R22 of which the region widths are partially expanded with the region-width-reduced portions R21 and thereafter placing the TEGs 3 in the TEG-placement portions R22 of the dividing regions R2 instead of forming the dividing regions with the constant region width as in the conventional manner in determining the arrangement of the device-formation-regions R1 and the dividing regions R2 on the semiconductor wafer 1, the region widths of the region-width-reduced portions R21 can be prevented from being restricted by the width dimensions of TEGs 3 (i.e., suffering restriction that the region widths must be formed greater than the width dimensions of TEGs 3 as in the conventional case).

In the dividing regions R2, by forming the partial regions where the TEGs 3 are placed as the TEG-placement portions R22 that have width dimensions greater than the width dimensions of the TEGs 3 and forming the regions where the TEGs 3 are not placed as the region-width-reduced portions R21 that have width dimensions smaller than the width dimensions of the TEGs 3, the distance between the edge portions of mutually adjacent device-formation-regions R1 can be put closer to each other regardless of the arrangement of the TEGs 3 on the semiconductor wafer 1.

Particularly, when the distance between the edge portions is reduced as described above, the device-formation-regions R1 can reliably be divided by the plasma etching so long as a limit dimension is secured as the distance such that the dimension separation by the plasma etching can be performed and no influence is exerted on the manufacturing process of the semiconductor chips 10.

Therefore, a semiconductor wafer and a semiconductor chip manufacturing method capable of increasing the number of semiconductor chips obtainable per unit area in comparison with the conventional semiconductor wafer provided with TEGs can be provided.

Moreover, the TEGs 3, which are formed in the dividing regions R2 during the manufacturing process of the semiconductor chips 10 for the characteristic investigation, are formed of, for example, materials that contain metals and inorganic substances different from the materials of silicon and silicon oxide of the objective materials to be etched by the plasma etching besides the materials. Therefore, with regard to the conventionally problem that the TEGs 3 cannot be removed depending on the plasma etching for the individualization of the semiconductor chips 10, it is possible to separate the TEGs 3 from the respective semiconductor chips 10 by performing the plasma etching and thereafter remove the TEGs 3 adhesively stuck to the protective sheet 4 in contact with the sheet from the respective dividing regions R2 (i.e., TEG-placement portions R22) located between the semiconductor chips 10 by peeling off the protective sheet 4 adhesively stuck to the circuit-formation-face 1a of the semiconductor wafer 1 for the protection of the surface from the surface.

Therefore, even when the semiconductor wafer 1 is subjected to the dividing process by using the plasma dicing, it is possible to eliminate the need for performing the plasma etching for the removal of the TEGs 3 by purposely changing the gas type and remove the TEGs 3 by only carrying out the operation of merely peeling off the protective sheet 4, so that the removal of the TEGs can be achieved through efficient operation.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2005-4860 filed on Jan. 12, 2005 including specification, drawing and claims are incorporated herein by reference in its entirety.

The invention claimed is:

1. A manufacturing method for semiconductor chips, the method comprising:
    providing a semiconductor wafer having a first surface and a second surface, the second surface being disposed opposite to the first surface, wherein the semiconductor wafer includes a plurality of device-formation regions on the first surface and a plurality of dividing regions on the first surface, the dividing regions dividing the device-formation regions from each other, wherein the dividing regions include region-width-reduced portions and a TEG-placement portion, the region-width-reduced portions having widths smaller than a width of the TEG-placement portion;
    forming a semiconductor device on the first surface of the semiconductor wafer in each of the device-formation regions;
    forming a TEG on the first surface of the semiconductor wafer in the TEG-placement portion;
    sticking a protective sheet onto the first surface of the semiconductor device such that the protective sheet contacts the TEG;
    placing a mask on the second surface of the semiconductor wafer so as to define the diving regions on the second surface;
    performing plasma etching on the second surface of the semiconductor wafer with the protective sheet stuck to the first surface of the semiconductor wafer and the mask placed on the second surface of the semiconductor wafer such that the portions of the semiconductor wafer in the dividing regions are removed and the TEG remains stuck to the protective sheet, and such that the device-formation-regions are divided from each other to form semiconductor chips, each of the semiconductor chips including one of the semiconductor devices; and
    after said plasma etching operation is performed, removing the TEG by peeling off the protective sheet from the semiconductor chips, the TEG being stuck to the protective sheet.

2. The manufacturing method of claim 1, wherein the width of the TEG-placement portion is greater than a width of the TEG, and
    wherein the widths of the region-width-reduced portions are smaller than the width of the TEG.

3. The manufacturing method of claim 1, wherein the TEG-placement portion is arranged adjacent to a corner portion of the device-formation-regions.

4. The manufacturing method of claim 1, wherein the device-formation-regions are rectangular regions,
    wherein the dividing regions include a plurality of first dividing regions for dividing mutually adjacent device-formation-regions in a first direction and a plurality of second dividing regions for dividing in a second direction perpendicular to the first direction as the region-width-reduced portions,
    wherein each device-formation-region includes corner portions formed at intersections of the first dividing regions and the second dividing regions, and
    wherein the dividing regions are arranged in a manner that the TEG-placement portion is formed by partially expanding widths of the first dividing regions and the second dividing regions so that corner portions of the device-formation-regions are set back inward.

5. The manufacturing method of claim 4, wherein the first dividing regions and the second dividing regions have width dimensions smaller than the width dimension of the TEG, and the TEG-placement portions have width dimensions greater than the width dimension of the TEG.

6. The manufacturing method of claim 4, wherein the TEG-placement portion is formed so that the corner portions of the device-formation-regions facing the intersection are roughly curved convex surface portions.

7. The manufacturing method of claim 4, wherein the TEG-placement portion is formed by chamfering the corner portions of the device-formation-regions facing the intersection.

8. The manufacturing method of claim 4, wherein the semiconductor chips are separated by said peeling off the protective sheet operation.

9. The manufacturing method of claim 1, wherein each of the semiconductor chips is stuck to the protective sheet before said peeling off the protective sheet operation,
    wherein the semiconductor chips are separated from each other by said peeling off the protective sheet operation, and
    wherein the TEG remains stuck to the protective sheet as the protective sheet is peeled from the semiconductor chips.

10. A manufacturing method for semiconductor chips, the method comprising:
    providing a semiconductor wafer having a first surface and a second surface, the second surface being disposed opposite to the first surface;
    determining an arrangement of a plurality of device-formation regions on the first surface of the semiconductor wafer and a plurality of dividing regions on the first surface of the semiconductor wafer, the dividing regions dividing the device-formation regions from each other, wherein the dividing regions include region-width-reduced portions and a TEG-placement portion, the region-width-reduced portions having widths smaller than a width of the TEG-placement portion;

forming a semiconductor device on the first surface of the semiconductor wafer in each of the device-formation regions;

forming a TEG on the first surface of the semiconductor wafer in the TEG-placement portion;

sticking a protective sheet onto the first surface of the semiconductor device such that the protective sheet contacts the TEG;

placing a mask on the second surface of the semiconductor wafer so as to define the diving regions on the second surface;

performing plasma etching on the second surface of the semiconductor wafer with the protective sheet stuck to the first surface of the semiconductor wafer and the mask placed on the second surface of the semiconductor wafer such that the portions of the semiconductor wafer in the dividing regions are removed and the TEG remains stuck to the protective sheet, and such that the device-formation-regions are divided from each other to form semiconductor chips, each of the semiconductor chips including one of the semiconductor devices; and after said plasma etching operation is performed, removing the TEG by peeling off the protective sheet from the semiconductor chips, the TEG being stuck to the protective sheet.

11. The manufacturing method of claim 10, wherein the width of the TEG-placement portion is greater than a width of the TEG, and wherein the widths of the region-width-reduced portions are smaller than the width of the TEG.

12. The manufacturing method of claim 10, wherein the TEG-placement portion is arranged adjacent to a corner portion of the device-formation-regions.

13. The manufacturing method of claim 10, wherein the device-formation-regions are rectangular regions, wherein the dividing regions include a plurality of first dividing regions for dividing mutually adjacent device-formation-regions in a first direction and a plurality of second dividing regions for dividing in a second direction perpendicular to the first direction as the region-width-reduced portions, wherein each device-formation-region includes corner portions formed at intersections of the first dividing regions and the second dividing regions, and wherein the dividing regions are arranged in a manner that the TEG-placement portion is formed by partially expanding widths of the first dividing regions and the second dividing regions so that corner portions of the device-formation-regions are set back inward.

14. The manufacturing method of claim 13, wherein the first dividing regions and the second dividing regions have width dimensions smaller than the width dimension of the TEG, and the TEG-placement portions have width dimensions greater than the width dimension of the TEG.

15. The manufacturing method of claim 13, wherein the TEG-placement portion is formed so that the corner portions of the device-formation-regions facing the intersection are roughly curved convex surface portions.

16. The manufacturing method of claim 13, wherein the TEG-placement portion is formed by chamfering the corner portions of the device-formation-regions facing the intersection.

17. The manufacturing method of claim 13, wherein the semiconductor chips are separated by said peeling off the protective sheet operation.

18. The manufacturing method of claim 10, wherein each of the semiconductor chips is stuck to the protective sheet before said peeling off the protective sheet operation, wherein the semiconductor chips are separated from each other by said peeling off the protective sheet operation, and wherein the TEG remains stuck to the protective sheet as the protective sheet is peeled from the semiconductor chips.

19. A manufacturing method for semiconductor chips, the method comprising:

providing a semiconductor wafer having a first surface and a second surface, the second surface being disposed opposite to the first surface;

determining an arrangement of a plurality of device-formation regions on the first surface of the semiconductor wafer and a plurality of dividing regions on the first surface of the semiconductor wafer, the dividing regions dividing the device-formation regions from each other, wherein the dividing regions include region-width-reduced portions and TEG-placement portions, and the TEG-placement portions are arranged such that each device-formation regions has a corresponding TEG-placement portion;

forming a semiconductor device on the first surface of the semiconductor wafer in each of the device-formation regions;

forming a TEG on the first surface of the semiconductor wafer in each of the TEG-placement portions;

sticking a protective sheet onto the first surface of the semiconductor device such that the protective sheet contacts each of the TEGs;

placing a mask on the second surface of the semiconductor wafer so as to define the diving regions on the second surface;

performing plasma etching on the second surface of the semiconductor wafer with the protective sheet stuck to the first surface of the semiconductor wafer and the mask placed on the second surface of the semiconductor wafer such that the portions of the semiconductor wafer in the dividing regions are removed and the TEGs remain stuck to the protective sheet, and such that the device-formation-regions are divided from each other to form semiconductor chips, each of the semiconductor chips including one of the semiconductor devices; and after said plasma etching operation is performed, removing the TEGs by peeling off the protective sheet from the semiconductor chips, the TEGs being stuck to the protective sheet, wherein the region-width-reduced portions have widths smaller than widths of the TEG-placement portions, wherein each of the semiconductor chips is stuck to the protective sheet before said peeling off the protective sheet operation, wherein the semiconductor chips are separated from each other by said peeling off the protective sheet operation, and wherein the TEGs remain stuck to the protective sheet as the protective sheet is peeled from the semiconductor chips.

20. The manufacturing method of claim 19, wherein the device-formation-regions are rectangular regions, wherein the dividing regions include a plurality of first dividing regions for dividing mutually adjacent device-formation-regions in a first direction and a plurality of second dividing regions for dividing in a second direction perpendicular to the first direction as the region-width-reduced portions, wherein each device-formation-region includes corner portions formed at intersections of the first dividing regions and the second dividing regions, and wherein the dividing regions are arranged in a manner that the TEG-placement portions are formed by partially expanding widths of the first dividing regions and the second dividing regions so that corner portions of the device-formation-regions are set back inward.

* * * * *